(12) United States Patent
Sparks

(10) Patent No.: US 8,587,070 B2
(45) Date of Patent: Nov. 19, 2013

(54) METHOD OF FORMING A SEMICONDUCTOR STRUCTURE

(75) Inventor: Terry Sparks, Niskayuna, NY (US)

(73) Assignee: Freescale Semiconductor, Inc., Austin, TX (US)

(*) Notice: Subject to any disclaimer, the term of this patent is extended or adjusted under 35 U.S.C. 154(b) by 112 days.

(21) Appl. No.: 13/359,174

(22) Filed: Jan. 26, 2012

(65) Prior Publication Data
US 2012/0126289 A1 May 24, 2012

Related U.S. Application Data

(63) Continuation of application No. 11/994,253, filed as application No. PCT/EP2005/008199 on Jun. 30, 2005, now Pat. No. 8,105,890.

(51) Int. Cl.
*H01L 27/092* (2006.01)

(52) U.S. Cl.
USPC .......................................... 257/355

(58) Field of Classification Search
USPC .......................................... 257/355, 347, 316
See application file for complete search history.

(56) References Cited

U.S. PATENT DOCUMENTS

| | | | |
|---|---|---|---|
| 6,140,684 A | 10/2000 | Chan et al. | |
| 6,306,698 B1 | 10/2001 | Wieczorek et al. | |
| 6,713,356 B1 | 3/2004 | Skotnicki et al. | |
| 7,928,474 B2* | 4/2011 | Lin et al. | 257/190 |
| 8,138,523 B2* | 3/2012 | Bedell et al. | 257/199 |
| 8,193,057 B2* | 6/2012 | Kang | 438/259 |
| 8,227,859 B2* | 7/2012 | Lee et al. | 257/334 |
| 8,298,897 B2* | 10/2012 | Chen et al. | 438/285 |
| 8,299,453 B2* | 10/2012 | Zhu | 257/19 |
| 2001/0053569 A1 | 12/2001 | Skotnicki et al. | |
| 2005/0037603 A1 | 2/2005 | Coronel et al. | |

(Continued)

FOREIGN PATENT DOCUMENTS

| | | |
|---|---|---|
| DE | 10142952 A1 | 12/2002 |
| JP | 2001-1297898 A | 5/2001 |
| WO | 0126160 A | 4/2001 |
| WO | 02059939 A | 8/2002 |

OTHER PUBLICATIONS

Bogulmilowicz et al: "Chemical Vapour etching of Si, SiGe, and Ge with HCL; Applications to the formation of their relaxed SiGe Buffers and to the Revelation of Threading Dislocations"; Semiconductor Science & Technology IOP, Bristol, GB vol. 20, No. 2, Feb. 2005, 9 pages.

(Continued)

*Primary Examiner* — Nathan Ha

(57) ABSTRACT

A method of forming a semiconductor structure comprises forming a first layer of silicon and then forming a second, silicon germanium, layer adjacent the silicon layer. A thin third layer of silicon is then formed adjacent the second layer. A gate structure is then formed upon the third layer of silicon using convention Complementary Metal Oxide Semiconductor processes. Trenches are then formed into the second layer and the structure is then exposed to a thermal gaseous chemical etchant, for example heated hydrochloric acid. The etchant removes the silicon germanium, thereby forming a Silicon-On-Nothing structure. Thereafter, conventional CMOS processing techniques are applied to complete the structure as a Metal Oxide Semiconductor Field Effect Transistor, including the formation of spacer walls from silicon nitride, the silicon nitride also filling a cavity formed beneath the third layer of silicon by removal of the silicon germanium.

20 Claims, 1 Drawing Sheet

(56) References Cited

U.S. PATENT DOCUMENTS

2005/0062080 A1    3/2005    Nakamura et al.
2005/0079691 A1    4/2005    Kim et al.
2005/0189589 A1    9/2005    Zhu et al.

OTHER PUBLICATIONS

Borel, S. et al., "Control of Selectivity between SiGe and Si in Isotropic Etching Processes," Japenese Journal of Applied Physics, 43(63), 2004, pp. 3964-3966.

Isheden, C. et al., "MOSFETs with Recessed SiGe Source/Drain Junctions Formed by Selective Etching and Growth," Electrochemical and Solid-State Letters, 7 (4), 2004, pp. G53-G55.

Jurczak, M. et al., "Silicon-on-Nothing (SON)—an Innovative Process for Advanced CMOS," IEEE Transactions on Electron Devices, vol, 47, No. 11, Nov. 2000, pp. 2179-2187.

Jurczak, M. et al., "SON (Silicon on Nothing)—a New Device Architecture for the ULSI Era," Symposium on VLSI Technology Digest of Technical Papers, 1999, 2 pages.

Kreuzer, S. et al., "In situ defect etching of strained-Si layers with HCl gas," Materials Science in Semiconductor Processing 8, 2005, pp. 143-147.

International Search Report mailed Jan. 13, 2006 for PCT/EP2005/008199, 3 pages.

* cited by examiner

METHOD OF FORMING A SEMICONDUCTOR STRUCTURE

CROSS-REFERENCE TO RELATED APPLICATION(S)

This application is a continuation of U.S. patent application Ser. No. 11/994,253, entitled "Method of Forming a Semiconductor Structure," filed on Dec. 28, 2007, which is a National Stage Entry under 37 C.F.R. §371 of PCT/EP2005/008199, filed on Jun. 30, 2005, the disclosures of which are hereby expressly incorporated by reference in their entirety.

FIELD OF THE DISCLOSURE

This invention relates to a method of forming a semiconductor structure of the type, for example, comprising a layer of dielectric material disposed between two layers of semiconductor material.

BACKGROUND

In the field of semiconductor device fabrication, it is known to perform isotropic lateral etching of a sacrificial layer when manufacturing certain semiconductor devices. For example, a so-called "Silicon-On-Nothing" (SON) Metal Oxide Semiconductor Field Effect Transistor (MOSFET) makes use of a Silicon-Germanium (SiGe) sacrificial layer to disposed a thin silicon layer beneath a gate stack that serves as an active region for the MOSFET, the use of the thin silicon active region providing significant device performance advantages. As part of the fabrication process of the MOSFET, the Si—Ge sacrificial layer is laterally etched and replaced with an oxide buffer.

In order to etch the Si—Ge sacrificial layer, either a wet chemical etch solution or an isotropic plasma etching technique is employed in a downstream or remote plasma tool, such as a Chemical Downstream Etcher (CDE) or a Decoupled Plasma Source (DPS).

Whilst the use of isotropic plasma etching results in a very selective etch due to the electromechanical potential difference between silicon and silicon-germanium, it is difficult to control and cannot be readily monitored in-situ. Further, plasma etching for lateral etches does not currently provide adequate selectivity since the selectivity is lost when the silicon-germanium etch is completed or the etch endpoints is reach. For some applications, an additional masking layer of either resist, or a hard mask of oxide, may also have to be provided to enable plasma etching to be used.

In relation to the use of wet chemical etching solutions, these also suffer from a number of disadvantages. Indeed, whilst also selective, use of such solutions can result in mechanical damage to extremely small and delicate thin features of a device being etched. Additionally, progress of a wet chemical etch is difficult to monitor as no directly measurable parameter is available, for example by means of optical emission. Further, use of wet chemical etching solutions for lateral etching can be limited to the wetting of the etching solution in nano-sized features. Also, like DPS, wet chemical etching is also difficult to control and suffers from a loss of selectivity at Si—Ge endpoints.

SUMMARY

According to the present invention, there is provided a method of forming a semiconductor structure as set forth in the appended claims.

BRIEF DESCRIPTION OF THE DRAWINGS

At least one embodiment of the invention will now be described, by way of example only, with reference to the accompanying drawings, in which.

DETAILED DESCRIPTION OF THE DRAWINGS

Figure 1:
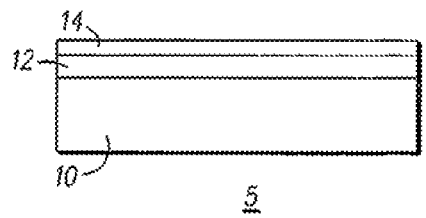
FIG. 1 is a schematic diagram of a foundation strata of 3 layers of semiconductor material.

Throughout the following description identical reference numerals will be used to identify like parts.

Referring to FIG. 1, a Metal Oxide Semiconductor Field Effect (MOSFET) transistor device 5 is formed by firstly growing a silicon substrate 10, constituting a first layer of semiconductor material, in accordance with a known Complementary Metal Oxide Semiconductor (CMOS) processing technique. Using a known suitable expitaxy deposition technique, a second, Silicon-Germanium, layer 12 is then grown on the silicon substrate 10 to a thickness of 30 nm. Thereafter a third, silicon, layer is grown on the Silicon-Germanium layer 12 to a thickness of 20 nm. Alternatively, the first layer of semiconductor material is formed from a different material to the third layer of semiconductor material.

Figure 2:
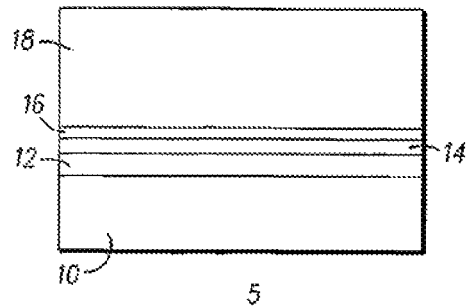
FIG. 2 is a schematic diagram the foundation of FIG. 1 supplemented by an insulating layer and an electrode layer formation of a gate stack.

Turning to FIG. 2, a gate stack is then formed using a conventional CMOS processing technique. In this example, a dielectric material, for example silicon dioxide ($SiO_2$), or typically a material with a dielectric constant greater than that of silicon, known as a high-K material, is then deposited as a gate insulator layer 16, on the silicon layer 14. The gate insulator layer 16 is grown to a thickness sufficient to constitute a high quality dielectric layer. Typically, the gate insulator layer 16 is grown to a thickness of between about 15 and 30 Angstroms depending on the dielectric constant of the material and the technological application.

Thereafter, polysilicon (PolySi) or a metal is deposited over the gate insulator layer 16 to form a gate electrode layer 18 and serve as a gate electrode.

Figure 3:
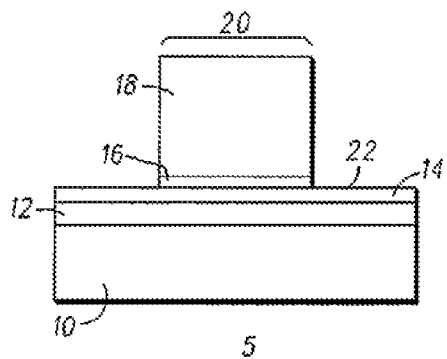
FIG. 3 is a schematic diagram of the gate stack formed from the structure of FIG. 2.

The gate insulator layer 16 and the gate electrode layer 18 are then subjected to an initial etch (FIG. 3) to form a gate stack 20, the gate insulator layer 16 sharing the profile of the gate electrode layer 18. Consequently, an upper surface 22 of the layer of silicon 14 is exposed.

Figure 4:
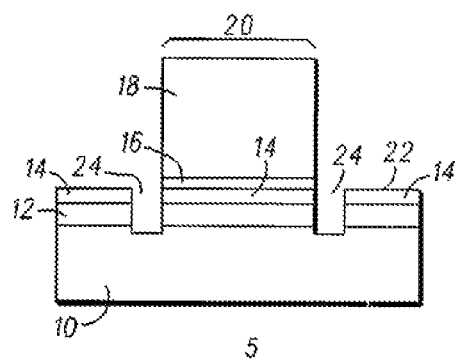
FIG. 4 is a schematic diagram of trenches formed in the structure of FIG. 3 in accordance with an embodiment of the invention.

Using conventional CMOS processing techniques (FIG. 4), a photoresist pattern (not shown) is used to protect an active area, typically using a mask that is a size revision of a mask used to form the active area.

Alternatively, other masking materials can be used to form the mask, depending upon a best sequence of fabrication integration, such as use of silicon nitride (SiN) to form a hard mask on the gate stack 20, since SiN has high resistance to fluorine and chlorine species etchants.

Using the photoresist pattern, a pair of trenches 24 is etched into areas of the layer of silicon 14 to be used for a source region and a drain region, respectively. The pair of trenches 24 is etched using a standard Reactive Ion Etching (RIE) process, thereby creating an opening in the layer of silicon 14 so as to expose the Si—Ge layer 12. In order to control the etching process, Optical Emission Spectroscopy (OES) signals can provide an ability to detect an end of the RIE process, known as endpoint detection. The etching of the trenches 24 is halted once the trenches have penetrated the Si—Ge layer 12, or when the trenches 24 begin to penetrate the substrate 10.

The device 5, usually formed as part of a semiconductor wafer (not shown), is then placed in a thermal reactor, for example, a single wafer epitaxy deposition tool or a Rapid Thermal Process (RTP) tool. Inside the tool, the Si—Ge layer 12 is exposed to a thermal gaseous chemical etchant, for example gaseous hydrochloric acid. The hydrochloric acid is maintained in a gaseous phase through heating, the gaseous hydrochloric acid being maintained at a temperature of between about 600.degree.C. and 900.degree.C., for example between about 700.degree.C. and 800.degree.C., such as between about 750.degree.C. and 800.degree.C. Additionally, the pressure within the tool is lower than atmospheric pressure, typically 0.1 to 0.5 ATM (100 mTorr to 500 mTorr) and can be used with an inert dilutant gas, such as argon or helium. Use of dilutants and the reduced pressure serves to improve control of the ambient gas (the gaseous hydrochloric acid diluted with the dilutant gas) and uniformity of the etchant gas flow and reduces the reactant flows to 100 to 200 sccm for a typical single wafer process tool.

In the gaseous phase, the chemical etchant etches isotropically and provides high selectively in order of more than 100:1 in favour of silicon germanium. For practical purposes, the selectivity can be considered to be almost infinite.

Although heated gaseous hydrochloric acid has been used in this example, the skilled person will appreciate that other thermal gaseous etchants can be used depending upon the material to be etched, for example chlorine (Cl.sub.2) Boron Chloride (BCl.sub.3) or other suitable halogen gases.

Figure 5:
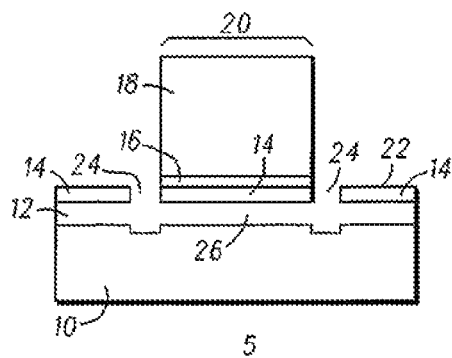
FIG. 5 is a schematic diagram of a sacrificial layer removed from the structure of FIG. 4 in accordance with the embodiment of the invention.

Referring to FIG. 5, the thermal gaseous chemical etchant isotropically etches the Si—Ge layer 12 laterally until substantially the entire Si—Ge layer 12 has been removed, and in this respect OES endpoints can again be used to control progress of the etchant, leaving a cavity 26 beneath the layer of silicon 14, i.e. between the layer of silicon 14 and the substrate 10.

Once the Silicon-Germanium has been removed from beneath a part of the layer of silicon 14 below the gate stack 20, i.e. the part of the layer of silicon 14 that will serve as a channel for the device 5, when in use, the photoresist is removed using a standard in-situ oxidization step and/or a separate so-called "plasma ash" process.

Thereafter, another conventional CMOS processing technique is employed to deposit a sidewall spacer 28 or silicon nitride (Si.sub.3N.sub.4) 30 adjacent both sides of the gate stack 20. The silicon nitride 30 also enters the cavity 26 via the pair of trenches 24 and fills the cavity 26 with the silicon nitride spacer material 30 during the deposition of the sidewall spacers 28. Alternatively, the cavity can be filled by means of a separate deposition stage to the creation of the sidewall spacers 28. The separate disposition stage can be used to fill the cavity 26 beneath the gate stack 20 with a different material to silicon nitride, for example a high emissivity (high-k) dielectric to improve electrical isolation of the active region from the bulk substrate or a combination of dielectric and conductor (poly-silicon) to form a bottom gate electrode creating a multi-gate ("gate-all-around") structure. As a further alternative, the cavity 26 can be left empty.

Figure 6:
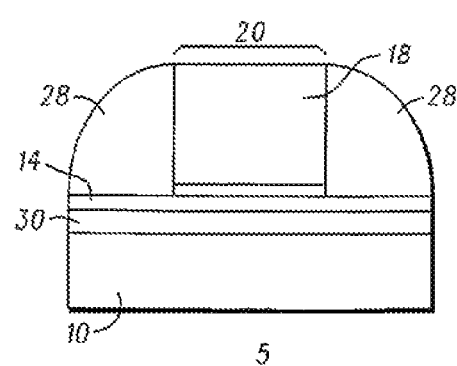
FIG. 6 is a schematic diagram of a partially completed device according to the embodiment of the invention.

Subsequently (and not shown in FIG. 6), source and drain regions are respectively formed either side of the gate stack 20 in the layer of silicon 14 using a conventional CMOS processing technique. Indeed, the rest of the device 5 is completed in accordance with the conventional CMOS processing techniques and so for the sake of clarity and conciseness of description will not be described further herein.

From the above example, the skilled person will appreciate that the thickness of the Si—Ge layer 12 can be altered in order to vary the volume of the cavity 26.

Although not described thus far, the above described transistor device can constitute a bit in a volatile memory unit, for example a Random Access Memory (RAM), such as Static RAM, sharing the active layer of silicon 12 with a number of like structured transistors. In fact, the skilled person should understand that the etching process by which the sacrificial Si—Ge layer 12 is removed is not limited to the formation of MOSFETs, or even transistors, but rather is a general process that can be used for other applications where isotropic lateral selective etching is required, for example in the formation of Silicon-On-Nothing (SON) structures or other three-dimensional device structures using bulk substrates. Indeed, the above-described thermal gaseous chemical etching process is applicable, for example, to creation of any nano-scale device, such a Micro Electrical-Mechanical Systems devices comprising very thin suspended silicon structures.

It is thus possible to provide a method of forming a semiconductor structure that provides greater etch selectivity than existing etching techniques for fabricating silicon on nothing devices. Additionally, the tools required to create the structure are simpler in nature to existing tools used to remove a sacrificial layer, such as the silicon germanium layer 12. Further, process parameters, such as time, temperature, gas flow and pressure, are more controllable than parameters used in relation to the existing tools for removing the sacrificial layer. Consequently, process complexity is reduced, resulting in a significant manufacturing cost saving.

What is claimed is:

1. A device comprising:
a first material layer;
a second material layer disposed over the first material layer;
a third material layer disposed over the second material layer;
a gate insulator layer disposed over the third material layer;
a gate electrode layer disposed over the gate insulator layer;
wherein the third material layer defines first and second trenches on opposite sides of the gate insulator layer and extending through the third material layer;
wherein the second material layer defines a region free of a semiconductor material of the second material layer and extending between the first and third material layers under the gate insulator layer; and
an insulator structure disposed in the region defined by the second material layer, extending through the first and second trenches of the third material layer, and forming sidewalls adjacent the gate insulator layer and the electrode layer.

2. The device of claim 1, wherein a semiconductor material of the first material layer is different from the semiconductor material of the second material layer.

3. The device of claim 1, wherein a semiconductor material of the third material layer is different from the semiconductor material of the second material layer.

4. The device of claim 1, wherein the first material layer comprises silicon.

5. The device of claim 1, wherein the third material layer comprises silicon.

6. The device of claim 1, wherein the second material layer comprises silicon-germanium.

7. The device of claim 1, wherein the first material layer forms a substrate.

8. The device of claim 1, wherein the insulator structure includes a nitride of silicon.

9. The device of claim 1, wherein the gate insulator layer comprises silicon dioxide.

10. The device of claim 1, further comprising a source region and a drain region formed in the third material layer on opposite sides of the gate insulator layer from each other and on different sides than the first and second trenches.

11. A device comprising:
   a first material layer;
   a second material layer disposed over the first material layer, the second material layer comprising silicon-germanium;
   a third material layer disposed over the second material layer, the third material layer comprising silicon;
   a gate structure disposed over the third material layer, the gate structure comprising:
      a gate insulator layer disposed over the third material layer; and
      a gate electrode layer disposed over the gate insulator layer;
   wherein the third material layer defines first and second trenches on opposite sides of the gate structure and extending through the third material layer;
   wherein the second material layer defines a region free of a semiconductor material of the second material layer and extending between the first and third material layers under the gate structure; and
   an insulator structure disposed in the region defined by the second material layer, extending through the first and second trenches of the third material layer, and forming sidewalls adjacent the gate structure.

12. The device of claim 11, wherein a semiconductor material of the first material layer is different from the semiconductor material of the second material layer.

13. The device of claim 11, wherein the first material layer comprises silicon.

14. The device of claim 11, wherein the first material layer forms a substrate.

15. The device of claim 11, wherein the insulator structure includes a nitride of silicon.

16. The device of claim 11, wherein the gate insulator layer comprises silicon dioxide.

17. The device of claim 11, further comprising a source region and a drain region formed in the third material layer on opposite sides of the gate structure from each other and on different sides than the first and second trenches.

18. A device comprising:
   a first material layer;
   a second material layer disposed over the first material layer;
   a third material layer disposed over the second material layer;
   a first gate structure including:
      a gate insulator layer disposed over the third material layer; and
      a gate electrode layer disposed over the gate insulator layer;
   wherein the third material layer defines first and second trenches on opposite sides of the first gate structure and extending through the third material layer;
   wherein the second material layer defines a region free of a semiconductor material of the second material layer and extending between the first and third material layers under the first gate structure; and
   a second gate structure disposed in the region defined by the second material layer.

19. The device of claim 18, wherein the second material layer comprises silicon-germanium.

20. The device of claim 18, wherein the second gate structure includes conductive polysilicon.

* * * * *